(12) United States Patent
Lemaitre et al.

(10) Patent No.: US 10,553,711 B2
(45) Date of Patent: Feb. 4, 2020

(54) TUNABLE BARRIER TRANSISTORS FOR HIGH POWER ELECTRONICS

(71) Applicant: University of Florida Research Foundation, Inc., Gainesville, FL (US)

(72) Inventors: Maxime G. Lemaitre, Gainesville, FL (US); Xiao Chen, Gainesville, FL (US); Bo Liu, Gainesville, FL (US); Mitchell Austin McCarthy, Gainesville, FL (US); Andrew Gabriel Rinzler, Newberry, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 15/305,227

(22) PCT Filed: Apr. 24, 2015

(86) PCT No.: PCT/US2015/027525
§ 371 (c)(1),
(2) Date: Oct. 19, 2016

(87) PCT Pub. No.: WO2015/164749
PCT Pub. Date: Oct. 29, 2015

(65) Prior Publication Data
US 2017/0040443 A1    Feb. 9, 2017

Related U.S. Application Data

(60) Provisional application No. 61/983,779, filed on Apr. 24, 2014.

(51) Int. Cl.
*H01L 29/778* (2006.01)
*H01L 29/51* (2006.01)
(Continued)

(52) U.S. Cl.
CPC ......... *H01L 29/778* (2013.01); *B82Y 10/00* (2013.01); *H01L 29/1606* (2013.01);
(Continued)

(58) Field of Classification Search
CPC ... H01L 29/778; H01L 29/1606; H01L 29/45; H01L 29/517; H01L 29/0673; H01L 51/0048; H01L 51/0562; B82Y 10/00
See application file for complete search history.

(56) References Cited

U.S. PATENT DOCUMENTS

| 4,226,735 A | 10/1980 | Sakabe |
| 5,357,157 A | 10/1994 | Throngnumchai |

(Continued)

FOREIGN PATENT DOCUMENTS

| JP | 2005347378 | 12/2005 |
| JP | 201264727 A | 3/2012 |

(Continued)

OTHER PUBLICATIONS

International Search Report for PCT/US2015/027525 dated Jul. 23, 2015.

(Continued)

*Primary Examiner* — Jay C Chang
(74) *Attorney, Agent, or Firm* — Thomas Horstemeyer, LLP (57) ABSTRACT

Various aspects of tunable barrier transistors that can be used in high power electronics are provided. In one example, among others, a tunable barrier transistor includes an inorganic semiconducting layer; a source electrode including a nano-carbon film disposed on the inorganic semiconducting layer; a gate dielectric layer disposed on the nano-carbon film; and a gate electrode disposed on the gate dielectric layer over at least a portion of the nano-carbon film. The nano-carbon film can form a source-channel interface with the inorganic semiconducting layer. A gate field produced by the gate electrode can modulate a barrier height at the source-channel interface. The gate field may also modulate a barrier width at the source-channel interface.

19 Claims, 12 Drawing Sheets

(51) Int. Cl.
*H01L 29/45* (2006.01)
*H01L 29/16* (2006.01)
*B82Y 10/00* (2011.01)
*H01L 51/00* (2006.01)
*H01L 51/05* (2006.01)
*H01L 29/06* (2006.01)

(52) U.S. Cl.
CPC ............ *H01L 29/45* (2013.01); *H01L 29/517* (2013.01); *H01L 29/0673* (2013.01); *H01L 51/0048* (2013.01); *H01L 51/0562* (2013.01)

(56) References Cited

U.S. PATENT DOCUMENTS

| | | | |
|---|---|---|---|
| 9,214,644 B2 | 12/2015 | Rinzler et al. | |
| 9,601,707 B2 | 3/2017 | Rinzler et al. | |
| 2007/0102747 A1* | 5/2007 | Chen | B82Y 10/00 257/314 |
| 2008/0315183 A1* | 12/2008 | Kinoshita | B82Y 10/00 257/24 |
| 2010/0127241 A1* | 5/2010 | Gruner | B82Y 10/00 257/20 |
| 2010/0237336 A1* | 9/2010 | Rinzler | B82Y 10/00 257/40 |
| 2011/0215315 A1* | 9/2011 | Toguchi | B82Y 10/00 257/40 |
| 2012/0248416 A1 | 10/2012 | Zhou et al. | |
| 2013/0048951 A1* | 2/2013 | Heo | B82Y 10/00 257/29 |
| 2013/0277644 A1* | 10/2013 | Seo et al. | H01L 29/775 257/29 |
| 2014/0166984 A1* | 6/2014 | Gunlycke | H01L 29/775 257/39 |
| 2014/0268444 A1* | 9/2014 | Bertin | H01L 27/0266 361/56 |
| 2015/0318401 A1* | 11/2015 | Duan | H01L 29/66742 250/200 |
| 2015/0340631 A1* | 11/2015 | Rinzler | H01L 29/7395 257/40 |
| 2015/0364545 A1* | 12/2015 | Heo | H01L 29/1033 257/24 |

FOREIGN PATENT DOCUMENTS

| | | |
|---|---|---|
| JP | 201346028 A | 3/2013 |
| JP | 201346073 A | 3/2013 |
| JP | 20133521664 A | 6/2013 |
| WO | 2009036071 A2 | 3/2009 |
| WO | 2011109693 A2 | 9/2011 |

OTHER PUBLICATIONS

Supplementary European Search Report for EP 15 78 3542 dated Mar. 28, 2018.

Lin, et al., "High-Performance Carbon Nanotube Field-Effect Transistor With Tunable Polarities," IEEE Transactions on vol. 4, No. 5, Sep. 2005, pp. 481-489. Nanotechnology, vol. 4, No. 5, Sep. 2005, pp. 481-489.

Appenzeller, J., "Carbon Nanotubes for High-Performance Electronics—Progress and Prospect," Proceedings of the IEEE, vol. 96, No. 2, Feb. 2008, pp. 201-211.

Liao, et al., "High-k oxide nanoribbons as gate dielectrics for high mobility top-gated graphene transistors," PNAS, Apr. 13, 2010, vol. 107, No. 15, pp. 6711-6715.

Response to Supplementary European Search Report for EP 15782543 dated Mar. 28, 2018.

JP Patent Application No. 2016-563787, Office Action dated Jun. 25, 2019.

\* cited by examiner

TUNABLE BARRIER TRANSISTORS FOR HIGH POWER ELECTRONICS

CROSS REFERENCE TO RELATED APPLICATIONS

This application is the 35 U.S.C. § 371 national stage application of PCT Application No. PCT/US2015/027525, filed Apr. 24, 2015, which claims priority to, and the benefit of, U.S. provisional application entitled "TUNABLE BARRIER TRANSISTORS FOR HIGH POWER ELECTRONICS" having Ser. No. 61/983,779, filed Apr. 24, 2014, both of which are hereby incorporated by reference in their entirety.

STATEMENT REGARDING FEDERALLY SPONSORED RESEARCH OR DEVELOPMENT

This invention was made with government support under agreement ECCS-1232018 awarded by the National Science Foundation. The Government has certain rights in the invention.

BACKGROUND

Power conversion is used to regulate and distribute electricity—whether in megawatts transmitted along high-voltage power lines or nanoamps driven through the logic gates of a computer. The power conversion units, used to step one voltage or phase to another, to invert AC to DC, or to isolate a supply line, rely on electronic switches for their operation. The ideal switch oscillates between an on-state with near-zero resistance to current flow and an off-state approaching infinite resistance for a range of switching frequencies.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various examples related to tunable barrier transistors that can be used in high power electronics. Reference will now be made in detail to the description of the embodiments as illustrated in the drawings, wherein like reference numbers indicate like parts throughout the several views.

While traditional electromechanical systems can accommodate grid-scale loads, their slow switching speeds—on the order of seconds or minutes—limit the efficiency of the grid at large. Solid-state electronic switches (e.g., MOSFETs and IGBTs) can, on the other hand, be efficiently switched on and off at a broad bandwidth of frequencies from 10s of Hertz to 100s of gigaHertz, but they have been limited to low and medium-level power management applications. The use of carbon nanotubes and/or graphene with perforations allows for the development of discrete and integrated tunable barrier transistors that can efficiently drive very large currents (>100 A) when on, while blocking large voltages (>1 kV) in their off state.

Figure 1A:
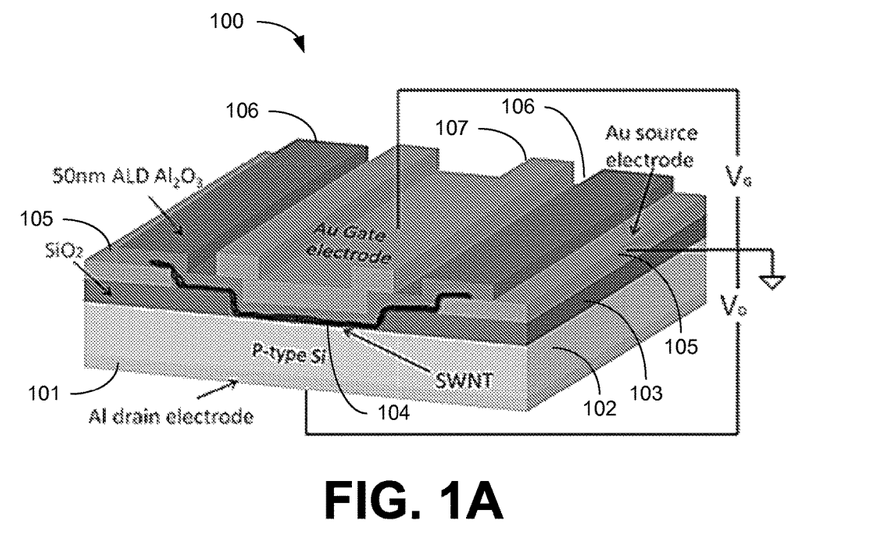
FIGS. 1A and 1B are views of an example of a tunable barrier transistor (TBT) device in accordance with various embodiments of the present disclosure.
Figure 1B:
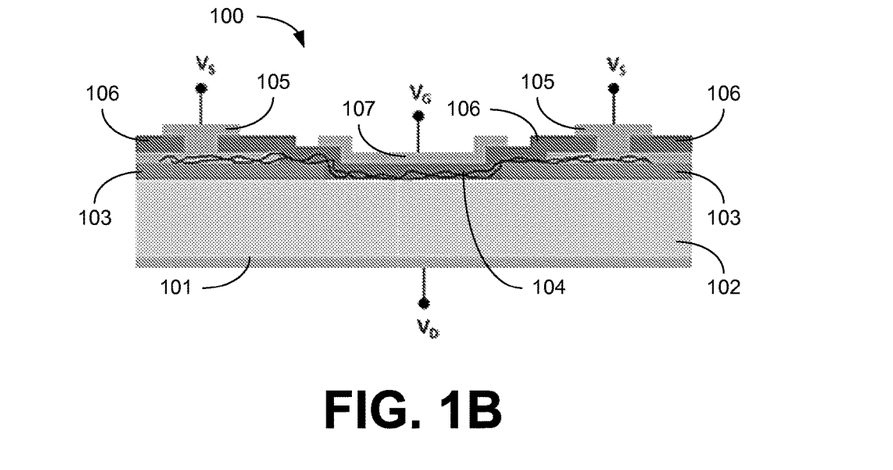

Referring to FIGS. 1A and 1B, shown are perspective and cross-sectional views of an example of a silicon-based, carbon-nanotube enabled, vertical tunable barrier transistor (TBT) 100, respectively. The vertical TBT 100 includes a drain electrode 101 disposed on one side of an inorganic silicon layer (or substrate made of, e.g., a crystalline semiconductor) 102. On the other side of the inorganic silicon layer 102, is a dielectric layer 103 (e.g., $SiO_2$) which includes openings or gaps exposing the underlying semiconductor 102. In the example of FIGS. 1A and 1B, a dilute network of carbon nanotubes 104 extends across the dielectric layer 103 and the exposed semiconductor layer 102 to source electrode contacts 105 disposed on the dielectric layer 103 opposite the semiconductor layer 102. In some implementations, the source electrode contacts 105 can be formed over a portion of the dilute network of carbon nanotubes 104 to form the source electrode.

Figure 2:
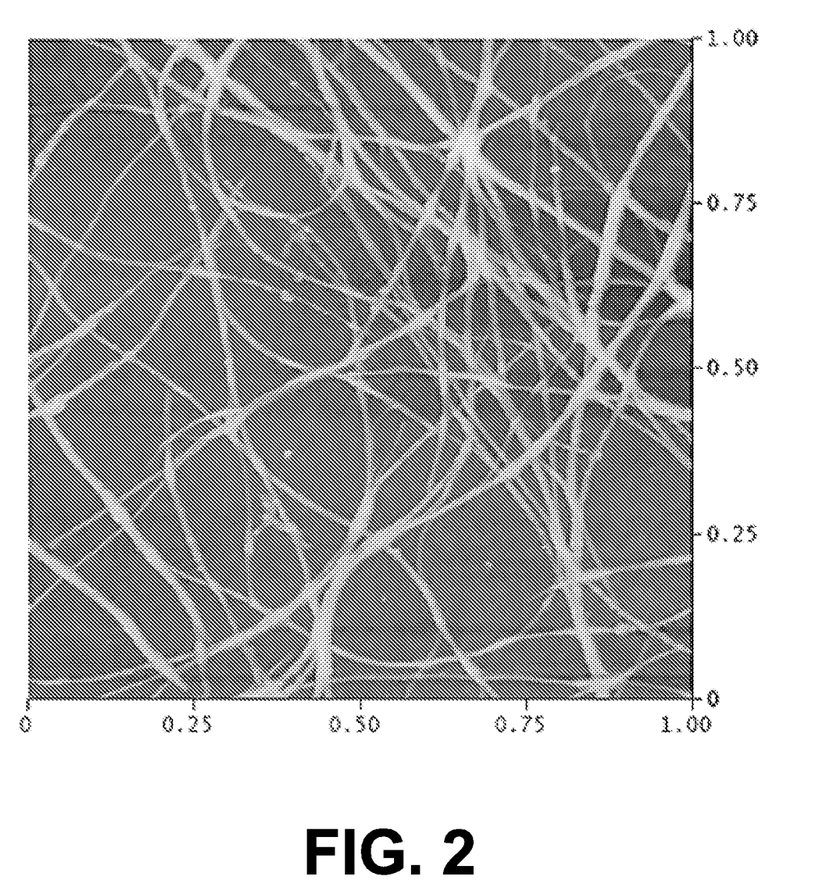
FIG. 2 is an atomic force microscopy image of a dilute network of carbon nanotubes in accordance with various embodiments of the present disclosure.

The dilute network of carbon nanotubes 104 can include single wall nanotubes (SWNT). FIG. 2 shows an atomic force microscopy image of an example of the dilute network of carbon nanotubes 104. The image shows a typical nanotube surface density used in TBT devices 100 at 1 micron×1 micron length scale. The bright, linear objects are single wall carbon nanotube bundles consisting of 1 to 10 nanotubes per bundle. In some embodiments, a sheet of graphene with perforations can be used in place of the carbon nanotubes 104. A key distinction of carbon nanotubes and graphene from conventional metals is that the low density of states (DOS) of these nanocarbons confers to them a tunable Fermi level, something not seen in high DOS conventional metals.

Referring back to FIGS. 1A and 1B, a thin layer of dielectric 106 is disposed across the TBT 100 on the dilute network of carbon nanotubes 104, between the source electrode contacts 105. A gate electrode 106 is disposed on the thin dielectric layer 106 over the dilute network of carbon nanotubes 104 in the opening or gap of the dielectric layer 103. The gating field can access the interface between the network of nanotubes 104 and the inorganic semiconductor 102 via the open regions between the nanotubes in the dilute network to modify the Schottky barrier and thereby control the current that flows between the source electrode contacts 105 through the inorganic semiconductor 102 to the drain 101. The spacing between the SWNT bundles (FIG. 2) of the dilute nanotube network 104 allows the gate field to readily access the nanotube-semiconductor interface. At substantially higher carbon nanotube surface densities (or with a continuous graphene sheet), the gate field is partially screened from the nanotube-semiconductor interface, and weakened by passing go through a tube/sheet, rather than being able to go around the carbon nanotubes 104.

Carbon nanotube or graphene enabled tunable barrier transistors (CN-TBT or G-TBT) are based on a gate tunable Schottky barrier formed between the nano-carbon source contact and an inorganic semiconducting channel. Since the characteristics of a metal-semiconductor junction are dictated (to first order) by the Fermi level offset between the junction partners, if the "metal" side of the junction is carbon nanotubes or graphene, gate field tuning of its Fermi level provides a way to tune the junction characteristics.

Figure 3:
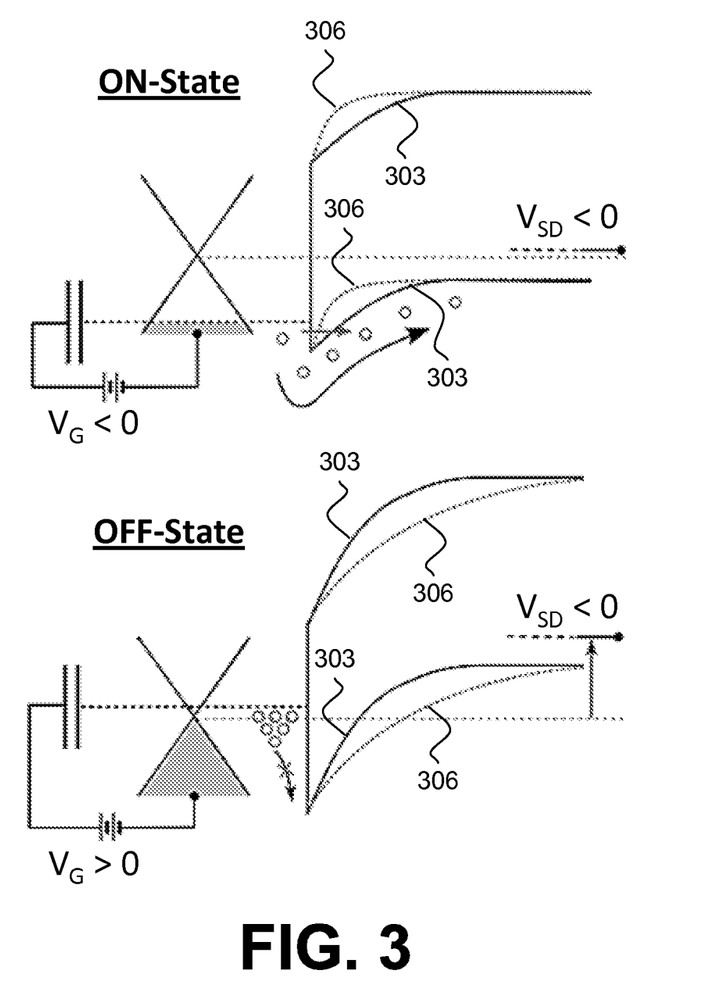
FIG. 3 is a schematic diagram of the current-injection modulation mechanism at work in a TBT in accordance with various embodiments of the present disclosure.

Rather than control the carrier density of the semiconducting channel between two Ohmic contacts as in conventional transistors, the gate voltage modulates the barrier height and width at the source-channel interface. Referring to FIG. 3, shown is a schematic diagram of the current modulation mechanism at work in a TBT 100. Rather than control the carrier concentration in the channel region between the Ohmic source and drain electrodes, the gate electrode controls the height (solid line 303) and width (dotted line 306) of the charge injection barrier at the Schottky junction formed between the source electrode and the semiconducting channel. The initial Schottky barrier helps to limit the off-state leakage currents, while the gate induced barrier lowering and thinning results in fully Ohmic injection in the on-state (the barrier may also lowered by an image-force effect in the semiconductor which is dependent on the source drain bias voltage). By operating the device in reverse bias, very large drive currents can be achieved while maintaining a high on/off ratio.

Notable aspects of the TBT 100 include:

a tunable work function source electrode consisting of a low density-of-states semimetal such as a graphene sheet or a carbon nanotube film;

engineered porosity and electric field transparency of the source electrode film to allow the gate-field access the semiconducting material;

a Schottky barrier formed between the ungated source electrode and the semiconducting channel;

a mechanism for gating the source electrode and adjacent semiconductor in order to control the resistance across the contact barrier;

an inorganic semiconducting channel with both high current carrying capacity and electric-field breakdown (Silicon or wide bandgap inorganic semiconducting or semi-insulating materials include, but are not limited to, GaN, SiC, AlN, and/or Diamond); and a device geometry in which the source contact is reverse biased relative to the drain electrode during normal operation.

Figure 4A:
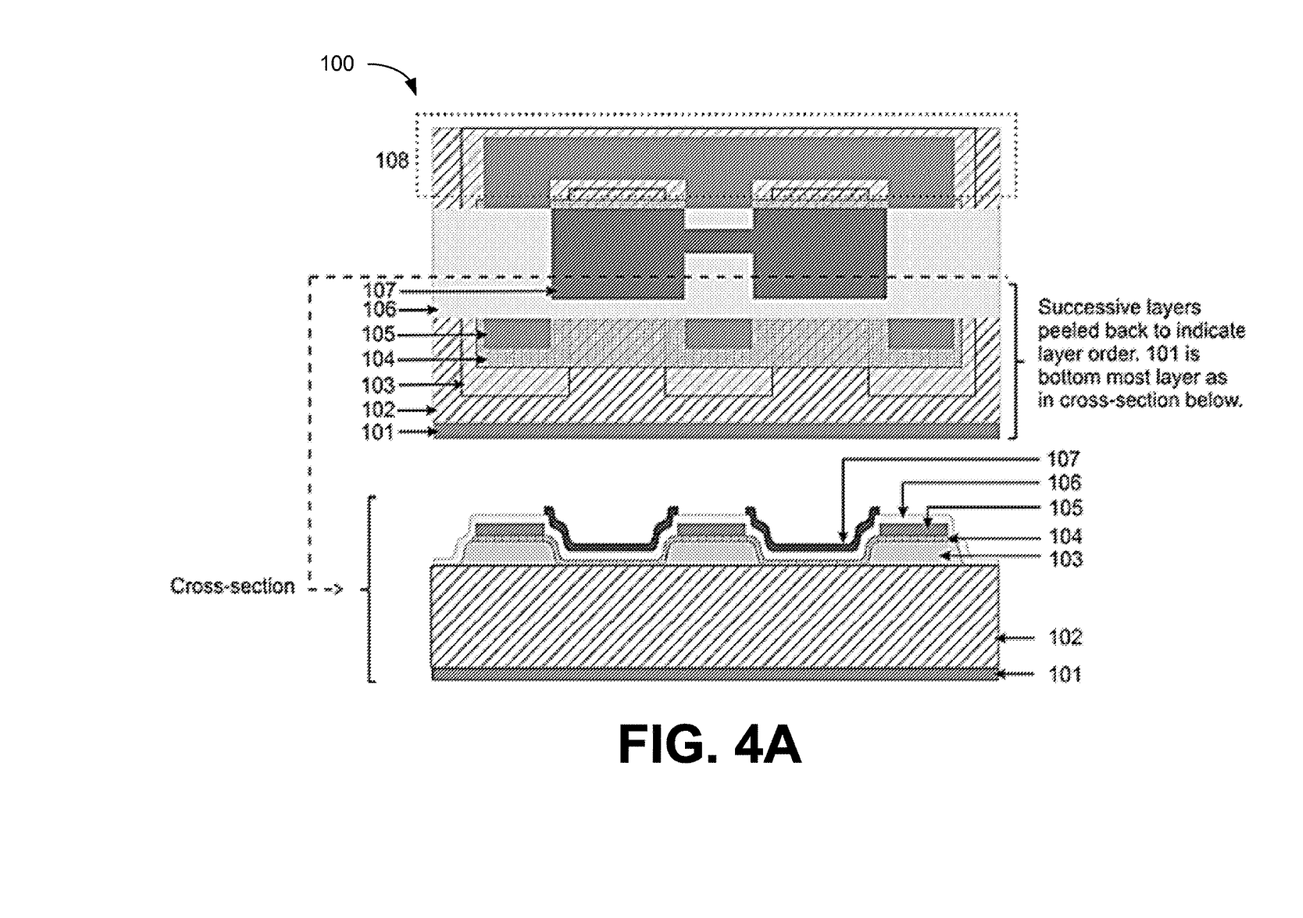
FIGS. 4A-4B and 5A-5B are views of examples of tunable barrier transistor (TBT) devices in accordance with various embodiments of the present disclosure.
Figure 4B:
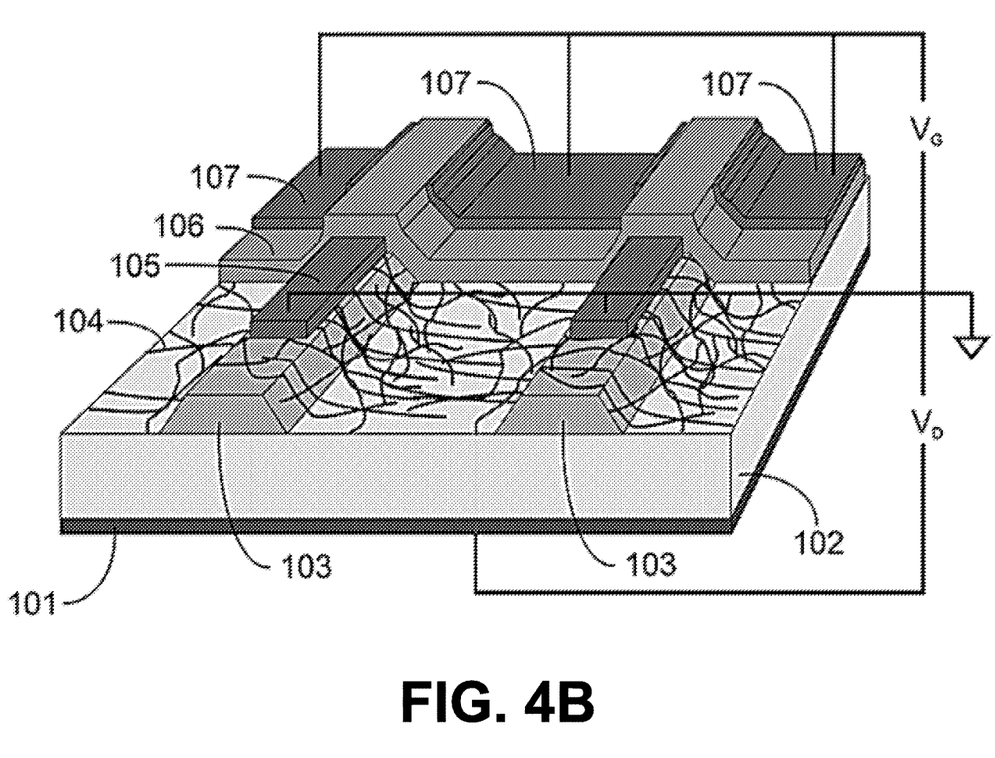

Referring to FIGS. 4A and 4B, shown are graphical representations of another example of a vertical TBT 100. FIG. 4A includes a top view with successive layers peeled back to illustrate the layer order, and a cross-sectional view showing the successive layers along the indicated dashed line, where layer 101 is the bottom most layer. FIG. 4B shows a perspective view with successive layers peeled back to further illustrate the layer order. In the example of FIGS. 4A and 4B, the TBT 100 is fabricated on a crystalline inorganic semiconductor such as Si, GaAs, GaN, or SiC, which is represented by layer 102. Layer 101 is the drain metal electrode deposited onto the back side of the semiconductor layer 102. The semiconductor 102 may include a highly doped diffused layer under the drain electrode (not shown) for the purpose of ensuring Ohmic contact to the drain electrode 101.

On the top surface of the semiconductor (opposite the drain electrode 101) is an oxide or nitride dielectric layer 103 (e.g., about 10 to about 500 nm thick), which has been patterned into a set of adjacent lines to expose the underlying semiconductor (SC) 102. While only 3 parallel lines are shown in FIG. 4A, the number of such lines, as well as their length, width and spacing between the lines, can be modified depending upon the total maximum current being controlled by the TBT device 100. Layer 104 represents the dilute network of carbon nanotubes. The dilute nanotube network 104 has a nanotube surface density that lies well above the percolation threshold with a surface density ranging by mass from about 0.05 µg/cm$^2$ to about 1.0 µg/cm$^2$.

As can be seen in FIGS. 4A and 4B, the nanotube network 104 lies across the tops of the dielectric lines 103 and runs down onto the exposed semiconductor 102 between the dielectric lines 103. The nanotube network 104 forms a portion of the source electrode. Metal (e.g., Al, Mo, Au, Cr, and/or Pd) is then deposited and defined by subtractive etching using photolithography to form the source electrode contacts 105, which contact the nanotube network 104 only on top of the dielectric layer lines 103. On at least one side of the TBT device 100 (see dotted boxed region 108), the dielectric runs between adjacent dielectric lines 103 and the metal of the source contact 105 electrically connects all the metal source contact lines 105 over the dielectric 103.

Following subsequent deposition of a dielectric layer 106, at least a portion of the metal 105 in this region will ultimately be exposed for making electrical connection to the source electrode. Because dangling bonds at semiconductor surfaces are a source of surface states that can affect Schottky barrier formation, chemical passivation of the semiconductor surface (e.g., hydrogen termination of Si or a thin native oxide of controlled thickness) can be carried out with the dilute nanotube network 104 in-situ at this step, immediately before a thin (e.g., about 30 to about 100 nm thick) dielectric layer 106 is deposited across the entire surface, including on the exposed semiconductor 102, nanotube network 104, dielectric lines 103 and source contact lines 105. This thin dielectric layer 106 is the gate dielectric.

Metal for the gate electrode 107 is next deposited and patterned so that the electrode is positioned above the portion of the nanotube network 104 that is not covered by the source electrode contacts 105. By avoiding gate and source contact overlap, parasitic capacitance can be reduced. When source, drain and gate pins are attached to the respective metal contacts 101, 105 and 107, respectively, the TBT device 100 is functionally complete. The TBT 100 can be encapsulated to protect it from the elements and provide heat sinking.

In the TBT devices 100, the crystalline-semiconductor cannot be deposited onto the nanotubes. Instead, the dilute network of nanotubes 104 is deposited onto the semiconductor 102 and the gate dielectric 106 is deposited onto the nanotube network 104 on the semiconductor surface. For the gate electrode 107 to exert control over the source-drain current, the gate dielectric layer 106 should be about 100 nm or less (e.g., about 3 to 100 nm, about 10 to 100, nm, about 25 to 100 nm, or about 50 to about 100 nm) to turn the TBT device 100 on and off at reasonable gate voltages.

The current carrying capacity of the nanotube network 104 may dictate the current limit of the TBT devices 100. Each nanotube in the network 104 can carry up to a limit of about 25 pA. Above this point, the electron phonon coupling begins to saturate further limiting current increases with increases in the voltage. The source contact electrode lines 105 provide bus bars that feed the current to the dilute nanotube network 104 that extends down to the semiconductor 102. Assuming a 10 micron spacing between the bus bars, each having a 10 micron width, it can be estimated that for the nanotube surface density in the range from about 0.05 µg/cm$^2$ to about 1.0 µg/cm$^2$, the current limit for the vertical TBT 100 will be on the order of several tens of thousands of amperes per cm$^2$.

Improvements in the manufacture of wide bandgap semiconductors such as GaN, SiC, and diamond suggest that cost-effective wide-bandgap semiconducting (WBS) wafers will become more widely available. Building TBTs on wide bandgap semiconductors, such as GaN, SiC, AlN, or diamond (either bulk wafers or epitaxial layers on carrier substrates) should allow for similar current densities, but with far superior blocking voltage ratings. The blocking voltage is a figure of merit for the power devices and is a function of the breakdown electric field, a fundamental property of the semiconducting material. For equivalent on-state resistances, the breakdown voltages in GaN, SiC, and diamond exceed that of silicon by 200, 500, and several 1000s times, respectively, suggesting that the TBT devices 100 can benefit from a similarly large increase in blocking voltage rating.

The output current in these silicon devices may be limited by the total on-state resistance. Both the CNT film resistance, $R_{CNT}$, and the silicon channel resistance, $R_{Si}$, can be optimized further to improve output current density without sacrificing ON/OFF ratio. Reducing the distance of the source contact metal to the edge of the silicon opening (or trench) and the width of the active interface could reduce the parasitic sheet resistance by a factor of 10 without the need for high resolution patterning. The thickness of the semiconducting channel could also be decreased by up to 500,000× if an ultra-thin silicon-on-insulator (SOI) substrate (or epitaxial GaN or SiC substrate) with a 100 nm layer is used. This should allow these TBT devices 100 to approach the theoretical current carrying capacity limit for our nanotube films of 30,000 A/cm$^2$—far exceeding state-of-the-art power transistors.

While vertically integrated TBT devices have been discussed, the described concept can be extended to lateral architectures. A lateral TBT device would place the source and drain electrodes side by side with the active semiconducting channel in between. In this configuration, the gate electrode can be made to overlap both the source electrode and the channel similar to existing Schottky-Barrier MOSFET designs. In this case, the work function of the source electrode, the nanotubes, AND the channel are being tuned by the gate field. Indeed such a TBT device would be able to support both the high current carrying capability in the on-state and the high blocking voltage desired in the off-state. Furthermore, an additional or alternative gate can be placed below the semiconducting channel to provide a stronger lever arm for transconductance (e.g., decreasing the subthreshold swing and/or enhancing the switching speeds).

Figure 5A:
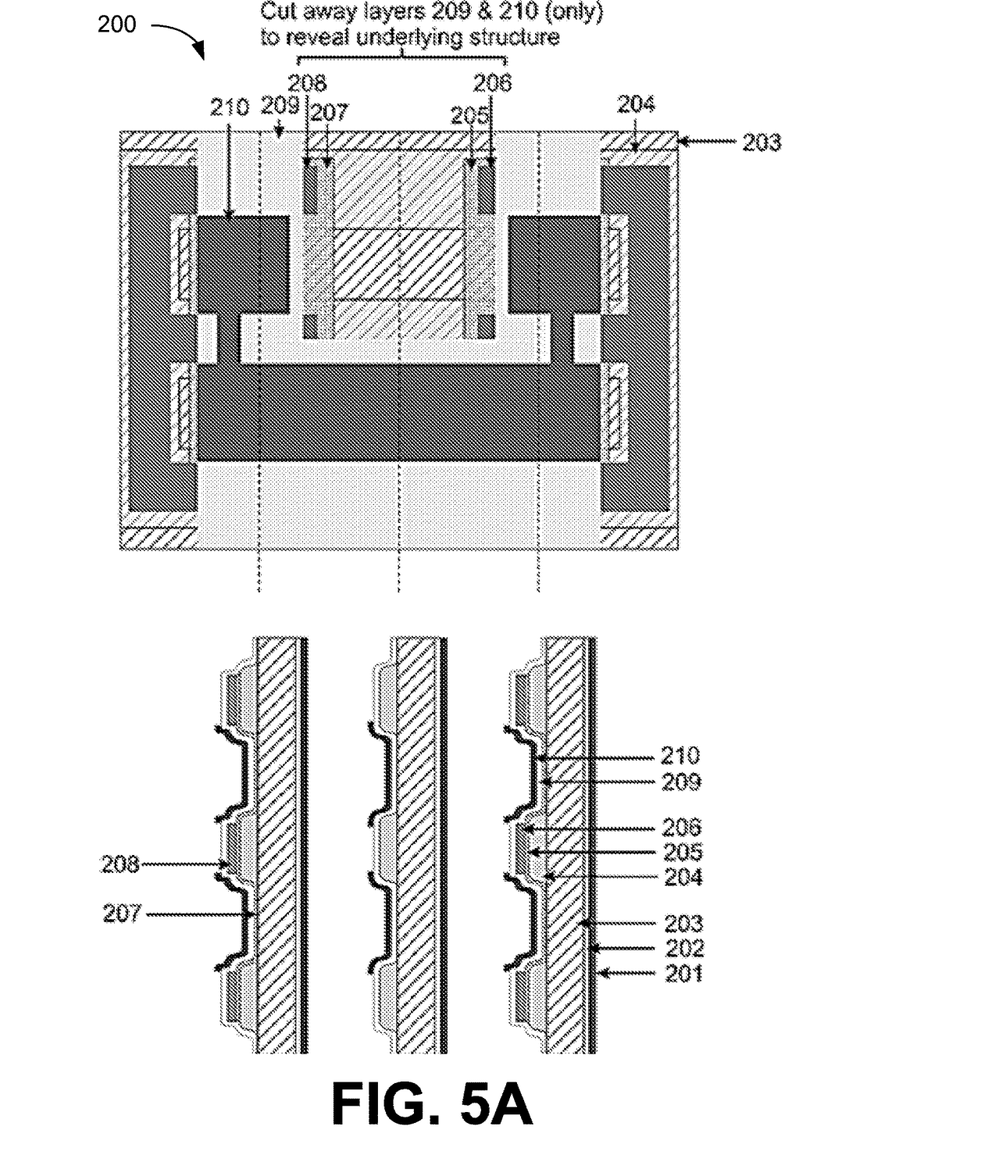
Figure 5B:
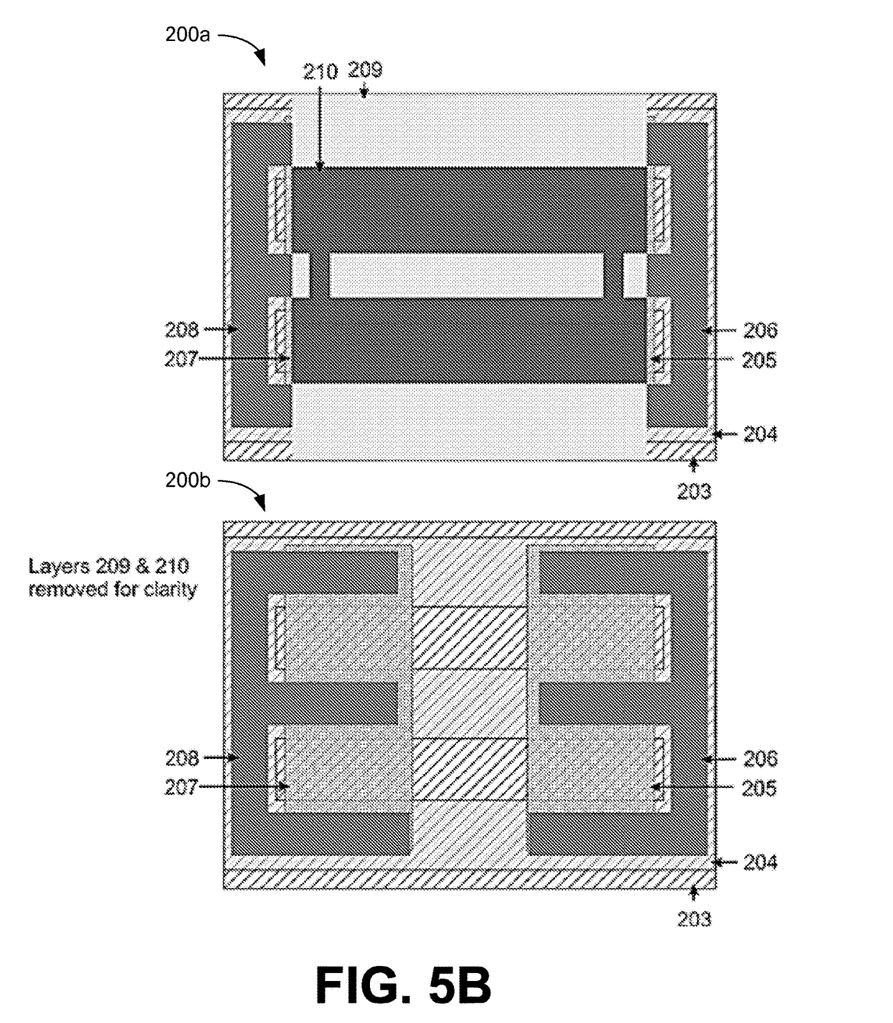

Referring next to FIGS. 5A and 5B, shown is a graphical representation of an example of a lateral TBT 200. FIG. 5A includes a top view with successive layers cut away to illustrate the layer order, and cross-sectional views showing the successive layers along the indicated dashed lines. The lateral orientation allows the device 200 to facilitate a large blocking voltage. The TBT 200 includes a back gate 201 and back gate dielectric 202 on one side of the inorganic semiconductor layer 203. FIG. 5B includes top views of the TBT 200a with all layers in place and the TBT 200b with the top gate dielectric layer 209 and top gate electrode 210 removed for illustration. As illustrated by TBT 200b, a dilute network of carbon nanotubes 205 for the drain electrode is disposed over portions of a dielectric layer 204 and the semiconductor 203 that are accessible through the dielectric layer 204. Drain electrode contacts 206 are coupled to the dilute network of carbon nanotubes 205 to form the drain electrode. A dilute network of carbon nanotubes 207 for the source electrode is also disposed over portions of the dielectric layer 204 and the semiconductor 203 that are accessible through the dielectric layer 204. Source electrode contacts 208 are coupled to the dilute network of carbon nanotubes 207 to form the source electrode. As illustrated by TBT 200a, the top gate dielectric layer 209 is disposed across the TBT 200, covering both the drain and source electrode, and the metal top gate electrode 210 is located on the top gate dielectric layer 209 between the drain and source electrode contacts 206 and 208, respectively.

The lateral TBT device 200 still relies on a gate modulated Schottky barrier formed between a tunable workfunction source electrode (including dilute network of carbon nanotubes or graphene with or without perforations) and the semiconducting channel. However, in the lateral TBT 200 of FIGS. 5A and 5B, the source electrode 207 and drain electrode 205 are placed practically in-plane with the semiconducting channel formed by the inorganic semiconductor layer 203. The gate dielectric 209 and the metal gate electrode 210 both extend beyond the edge of the source electrode contact 208 across the channel to the drain electrode contact 206. This allows the carrier concentration along the entire channel to be modulated as well as the barrier to charge injection at the source contact 208. This layout for the lateral TBT 200 also allows for flexibility in the choice of the drain electrode 205. For instance, an Ohmic or Schottky contact can be made to a conventional metal electrode or to another tunable workfunction nano-carbon electrode. The choice of a symmetric structure in which both the source electrode 207 and drain electrode 205 are nano-carbon films results in symmetric current output in forward and reverse bias.

The top gate stack (nanotube network 209 and contact 210) can be positioned above the source electrode/semiconductor interface just as in the vertical TBT device 100 (FIGS. 4A and 4B). However, if a thin-body semiconductor 203 is used as the semiconductor channel (e.g., SOI, GaN-on-Si, or epitaxial semiconductors), then an additional or alternative back gate stack (back gate 201 and dielectric 202) can be placed beneath the semiconducting channel 203. This allows for better gate control of the semiconducting channel and more complete gating of the interface between the nano-carbon source electrode (nanotube network 207) and the underlying semiconductor 203. A thin-body also results in more conventional current saturation behavior which can be useful for operational stability. This lateral architecture also readily allows for the semiconducting channel to be a two dimensional (2D) electron gas (e.g., AlGaN/GaN high electron mobility transistor (HEMT)).

In the embodiment of FIGS. 5A and 5B, the source contact 208 and drain contact 206 are isolated from the semiconducting channel by a dielectric layer 204 over which the nano-carbon is draped. In order to reduce the number of processing steps, some implementations can eliminate the dielectric layer 204. In such a case, the contact metals are chosen such that while they make good Ohmic contact to the nano-carbon electrode (dilute network of carbon nanotubes or graphene with or without perforations), they form a strong Schottky barrier with the semiconductor 203. If the Schottky barrier to the channel is large enough, the leakage currents (in the off-state) from the contacts 206 and 208 will be negligible, while the on-currents will be enhanced by additional charge injection directly from the contacts 206 and 208 into the semiconductor 203 (in addition to the injection from the nano-carbon electrodes).

The contact layout can also be more complex than what is depicted in order to maximize the current density, and can be extended (effectively increasing the channel width) to make a large device with very high total current output. The transistor properties are strongly dependent on the choice of semiconducting channel material and length (distance between the source electrode 207 and drain electrode 205). Careful selection of both can be used to balance the initial Schottky barrier, on-current channel resistance, and blocking voltage requirements.

Figure 6:
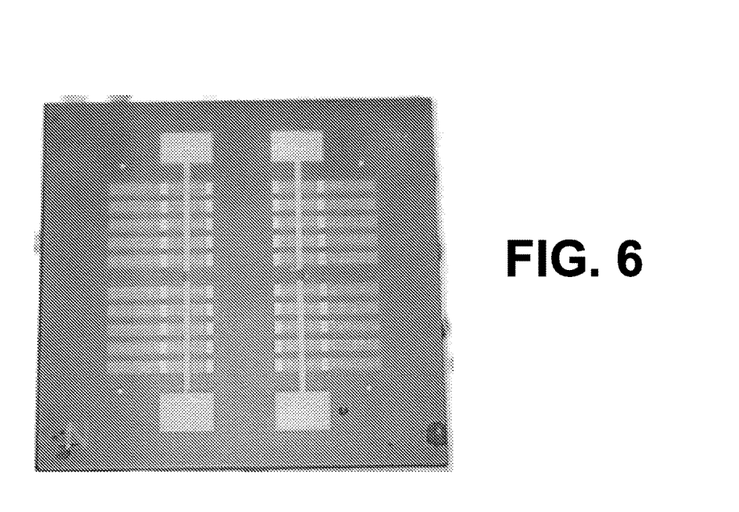
FIG. 6 is an image of a prototype silicon-based device including several carbon-nanotube enabled, vertical TBT devices in accordance with various embodiments of the present disclosure.

To demonstrate the device operating mechanism, the vertical TBT 100 shown in FIG. 1B was realized using a 500 μm, single-crystal silicon layer 102 as the semiconducting channel. In this embodiment, a dilute film of carbon nanotubes 104 served as the tunable-work function source electrode. The work function of the nanotubes 104 was modulated by a top gate 107 isolated by a thin, high-k, $Al_2O_3$ dielectric 106. The nanotube source electrode 105 was in contact with a passivated surface 103 of the silicon wafer 102, which acted as a vertically integrated channel layer. The drain contact 101 was made on the back side of the silicon wafer 102, defining the channel length as the thickness of the silicon wafer 102. FIG. 6 shows an image of a prototype silicon-based device consisting of 20 vertical CN-TBT 100 with a common drain and four independent gate electrodes.

To fabricate the vertical TBT devices 100, an Ohmic drain electrode 101 was first created on the back side of a 500 μm thick, p-type, <100> silicon wafer 102 (boron, p=50 cm). A thick film of photo resist was spun onto the top surface, to allow for a buffered oxide etch (BOE) of a 200 nm thermal oxide layer 103. The silicon wafer 102 was then immediately loaded into a thermal evaporation chamber and 80 nm of Al was deposited over the entire back surface of the silicon wafer 102. A 30 minute, 300° C. anneal in an Argon-ambient glovebox causes the Al at the surface to diffuse into the silicon 102, creating a heavily doped Si region in contact with the Al. The Ohmic drain contact 101 was completed by depositing 20 nm of Cr and 40 nm of Au on top of the Al layer.

In order for the nanotubes to make contact directly with the silicon, 20 um wide trenches are lithographically patterned on the front surface of the silicon 102 and the thermal oxide 103 is etched with BOE. Cr/Au (20/30 nm) source contacts 105 were then patterned 30 um from the edge of the trench via a lift-off process.

A 2 mm wide dilute (2 nm) nanotube film 104 was then transferred over the trenches. The synthesis and transfer process has been described elsewhere. See, e.g., "Large-scale purification of single-wall carbon nanotubes: process, product, and characterization" by A. G. Rinzler et al. (Applied Physics A Materials Science & Processing, vol. 67, no. 1, pp. 29-37, 1998). After transfer, the nanotube film 104 was patterned into 400 μm wide ribbons connecting the two source contacts 105, situated 260 μm apart. The substrate 102 was then baked at 250° C. for 30 minutes to dedope the nanotubes.

The behavior of the Schottky contact is affected by the details of the silicon-nanotube interface. The interface was passivated, post-transfer, using a thin $SiO_x$ layer. The samples were dipped in a dilute BOE solution (20:1, DI:BOE) for 8 min to ensure that the native oxide that formed during the nanotube transfer process was completely removed. The samples were then placed in ambient atmosphere under 1.5 AMU solar simulator illumination for 2 hours, resulting in a thin $SiO_x$ passivation layer below the nanotubes.

Next, a 60 nm $Al_2O_3$ gate dielectric 106 was deposited by a multistep Atomic Layer Deposition (ALD) process. To ensure a high quality dielectric, the growth was seeded by evaporating 3 successive, sub-monolayer, Al films (0.5 nm each), and briefly exposing the samples to air between depositions. A 10 nm $Al_2O_3$ layer is then grown using exposure-mode ALD at 90° C., followed by a 50 nm layer grown by standard thermal ALD at 200° C. This process ensured that a gate oxide with a minimum breakdown voltage of >20V is uniformly grown over the entire substrate (and specifically over the nanotubes). A multistep ALD process comprising just the exposure mode ALD at 90° C. followed by the standard mode process at 200° C. was also found to give good dielectric films with breakdown voltages >20V over the nanotubes and the entire substrate.

Finally, a Cr/Au (20/30 nm) gate electrode 107 was patterned above the entire trench by a lift-off process and Al etchant was used to etch vias through the top-gate oxide to the source contacts 105. A finished vertical TBT device 100 is shown in FIG. 1C.

The gate 107 and drain 191 are biased relative to a grounded source electrode 105 and the TBT devices 100 were measured at room temperature in ambient atmosphere using a Kiethley 2600 source meter and probe station. Both source electrodes 105 were contacted to minimize the effect of the parasitic series resistance of the nanotube film 104.

Figure 7A:
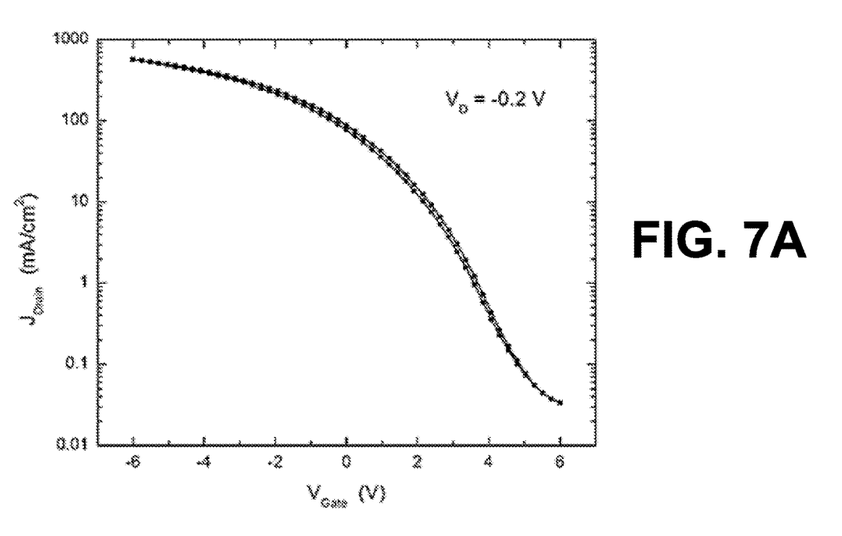
FIGS. 7A-7D and 8A-8B are plots illustrating the performance of silicon-based, carbon-nanotube enabled, vertical TBT devices in accordance with various embodiments of the present disclosure.

Referring to FIGS. 7A-7D, shown are plots illustrating the performance of vertical CN-TBT devices 100. FIG. 7A shows the transistor operation transfer curve of the CN-TBT 100 at a bias voltage of −0.2V. The current density was calculated based on the area (20 μm×400 μm) of the carbon nanotube overlap with the silicon trench. The relatively high output current observed for zero gate bias indicates that the initial Schottky barrier height was not as large as might be desired, but could be optimized with improved passivation of the silicon surface. In the ideal Schottky-Mott limit, the barrier height should be about 0.4 eV. The large transconductance observed for the modest ±6V gate voltage range demonstrates the effectiveness of the combined gate-induced barrier height lowering and thinning.

Figure 7B:
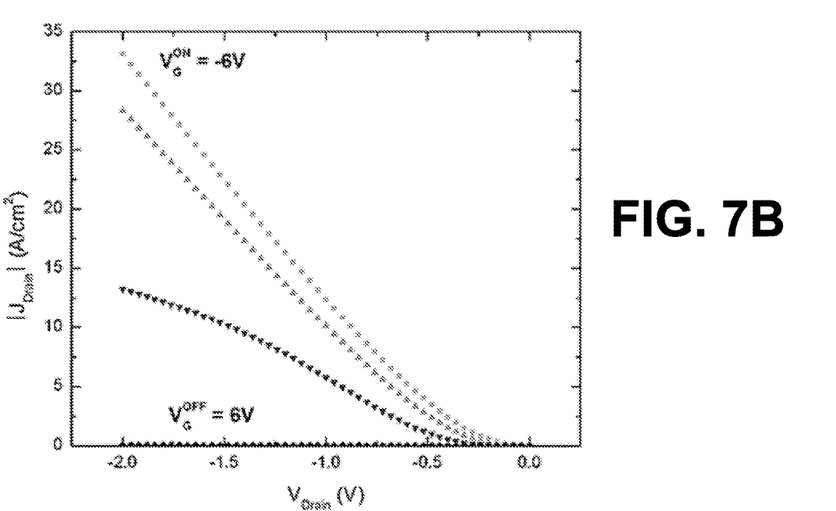
Figure 7C:
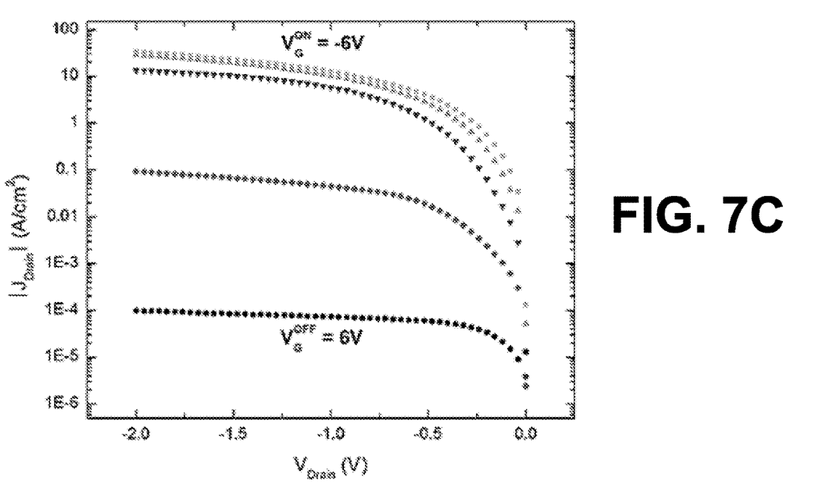
Figure 7D:
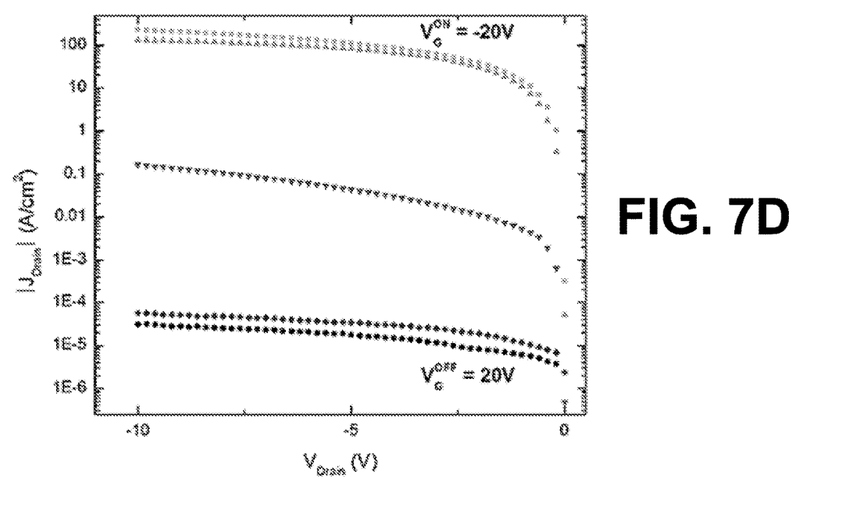

FIGS. 7B-7D show output curves of the CN-TBT 100 for various gate and source-drain bias voltages. The output curves were plotted (linear and logarithmic scale) in FIGS. 7B and 7C for a source-drain bias range of 0 to −2V. As shown in FIG. 7D, extending the gate and bias voltage ranges up to 20V and −10V, respectively, produces a maximum on-current density over 200 A/cm² with gate leakages currents of only 10 s of μA per cm². That the CN-TBT devices 100 maintain an ON/OFF ratio exceeding $10^6$— despite these large operating voltages—demonstrates their capacity to effectively modulate very large currents.

Figure 8A:
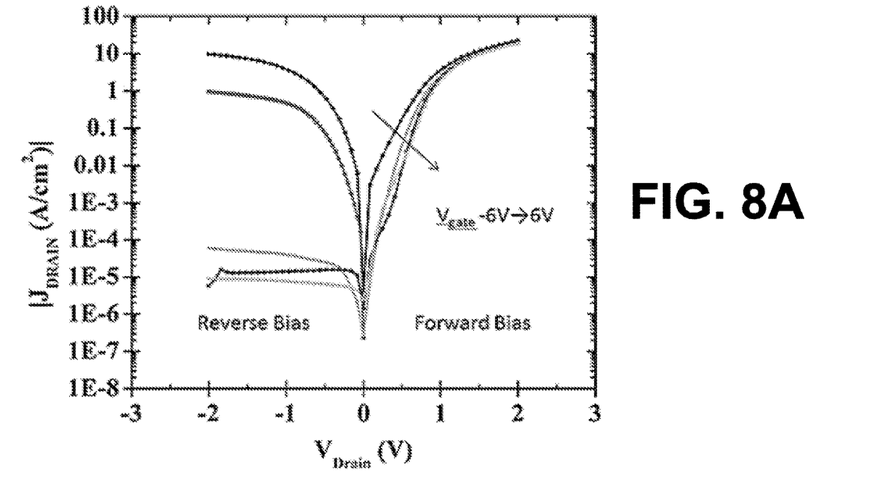
Figure 8B:
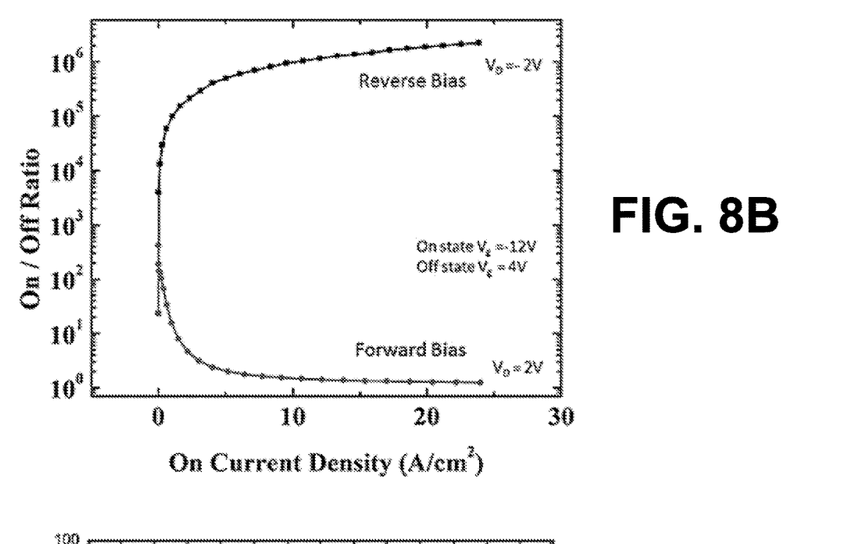

Referring to FIGS. 8A and 8B, shown are plots illustrating a comparison of the forward versus reverse bias output characteristics. Reverse-biasing with respect to the source contact Schottky barrier is an important aspect of practical operation of the CN-TBT devices 100. This can be seen in the full output behavior of FIG. 8A, which shows the full output curve for up to |2V| and |6V| of source-drain and gate bias, respectively. The range of the bias voltages for which the gate can efficiently modulate the current is very narrow in the forward bias regime. This is in contrast to the reverse bias mode shown in FIG. 8B, in which the on/off ratio remains high for the entire bias voltage range. FIG. 8B depicts the magnitude of current modulation exceeds $10^6$ for most reverse-mode drain voltages, while dropping rapidly below 100 in forward bias. Furthermore, the nearly equivalent maximum on-current for the forward and reverse bias modes suggests that when the CN-TBT device 100 is on, the CNT/silicon junction behaves as a good Ohmic contact.

Figure 9A:
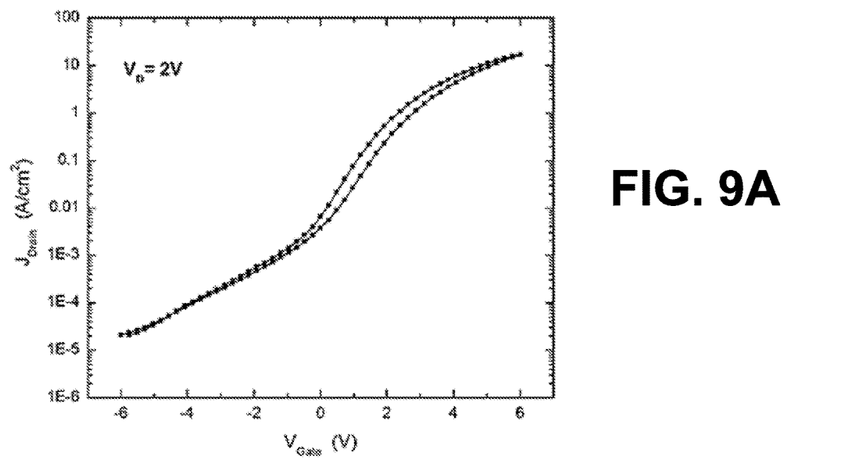
FIGS. 9A and 9B are plots illustrating examples of transfer and output curves of another carbon-nanotube enabled, vertical TBT device in accordance with various embodiments of the present disclosure.
Figure 9B:
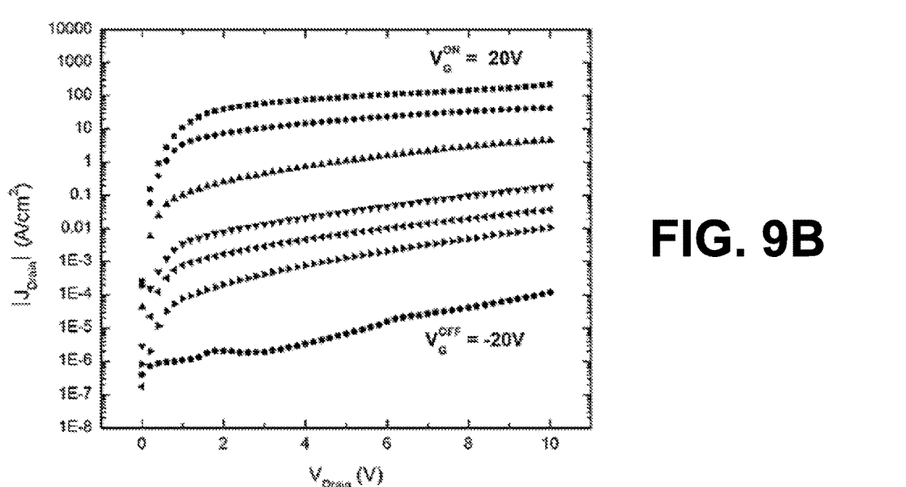

Vertical TBT devices 100 have also been built on n-type silicon wafers resulting in n-channel transistors, which can be important for complementary low power dissipation devices (e.g. inverters). FIG. 9A shows the transistor operation transfer curve of the CN-TBT 100 on n-type silicon (Phosphorus, p=0.5 Ωcm) at a bias voltage of 2V. FIG. 9B shows the output curve of the CN-TBT 100 (n-type) for various gate and source-drain bias voltages, reaching a maximum output current of 218 A/cm$^2$ at gate and bias voltages of 20V and 10V, respectively.

Finally, a vertical TBT device 100 has been described that achieves a large blocking voltage in the off state by virtue of being built with pure semiconducting single wall carbon nanotubes. Advances over the last few years in separating metallic from semiconducting carbon nanotubes have resulted in the commercial availability of single wall carbon nanotubes purified to 99.9% (and better) semiconducting nanotubes. For unseparated SWNTs, which contain a mixture of metallic and semiconducting nanotubes, the carrier density of the metallic nanotubes in the mix can never be reduced by the gate field to zero. In a vertical TBT device built with all semiconducting nanotubes, besides gate voltage control over the Schottky barrier height and width, the gate also attains control over the carrier density in the semiconducting carbon nanotubes. In this case the gate can push the Fermi level of the nanotubes deep into the nanotube bandgap resulting in a carrier density that is effectively zero thus providing a third mechanism for turning the devices on and off. Semiconducting nanotubes could also be used in the lateral channel device or other implementations discussed.

Tunable barrier transistors provide the ability to efficiently drive very large currents and block large voltages, which can be advantageous in high power applications such as, e.g., high power electronics. In an embodiment, a tunable barrier transistor comprises an inorganic semiconducting layer; a source electrode comprising a nano-carbon film disposed on a portion of a first side of the inorganic semiconducting layer, the nano-carbon film forming a source-channel interface with the inorganic semiconducting layer; a gate dielectric layer disposed on the nano-carbon film of the source electrode; and a gate electrode disposed on the gate dielectric layer over at least a portion of the nano-carbon film of the source electrode that is disposed on the portion of the first side of the inorganic semiconducting layer, where a gate field produced by the gate electrode modulates a barrier height at the source-channel interface. The inorganic semiconducting layer can be an n-type inorganic semiconducting layer or a p-type inorganic semiconducting layer. The gate field produced by the gate electrode can also modulate the barrier width at the source-channel interface.

In various embodiments, the inorganic semiconducting layer comprises a crystalline semiconductor. The crystalline semiconductor can be a single crystal semiconductor. The inorganic semiconducting layer can comprise silicon (Si), gallium nitride (GaN), silicon carbide (SiC), aluminum nitride (AlN), or diamond. In some embodiments, the nano-carbon film of the source electrode comprises a dilute network of carbon nanotubes. The dilute network of carbon nanotubes can have a nanotube surface density in a range of about 0.05 μg/cm$^2$ to about 1.0 μg/cm$^2$ by mass. The dilute network of carbon nanotubes can comprise a dilute network of pure semiconducting nanotubes with 99.9% or better purity. In an embodiment, the nano-carbon film of the source electrode comprises a sheet of graphene with perforations.

In various embodiments, the gate dielectric comprises a high-k dielectric. A thickness of the gate dielectric can be about 100 nm or less. The gate dielectric can exhibit dielectric breakdown at greater than 25 Volts or greater than 10 Volts. In one embodiment, among others, the tunable barrier transistor can comprise a drain electrode disposed on a second side of the inorganic semiconducting layer opposite the first side. In some embodiments, the tunable barrier transistor can comprise a dielectric layer disposed on a portion of the first side of the inorganic semiconducting layer; and a source contact of the source electrode disposed on the dielectric layer, wherein the nano-carbon film of the source electrode is coupled to the source contact. The gate dielectric layer can be further disposed on the source contact.

In various embodiments, the tunable barrier transistor can comprise a drain electrode comprising a nano-carbon film disposed on another portion of the first side of the inorganic semiconducting layer, the drain electrode separated from the source electrode by a distance. The gate dielectric layer can be further disposed on the nano-carbon film of the drain electrode and at least a portion of the channel between the source and drain electrode; and the gate electrode can be further disposed on the gate dielectric layer over at least a portion of the nano-carbon film of the drain electrode that is disposed on the other portion of the first side of the inorganic semiconducting layer. The nano-carbon film of the drain electrode can comprise a dilute network of carbon nanotubes. The dilute network of carbon nanotubes can comprise a dilute network of pure semiconducting nanotubes. In one embodiment, the nano-carbon film of the drain electrode comprises a sheet of graphene. In some embodiments, the tunable barrier transistor can comprise a dielectric layer disposed on a portion of the first side of the inorganic semiconducting layer; and a drain contact of the drain electrode disposed on the dielectric layer, wherein the nano-carbon film of the drain electrode is coupled to the drain contact. The gate dielectric layer can be further disposed on the drain contact. In various embodiments, the tunable barrier transistor can comprise a back gate electrode disposed on a second side of the inorganic semiconducting layer opposite the first side.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A tunable barrier transistor, comprising:
an inorganic semiconducting layer;
a source electrode comprising a porous nano-carbon film disposed on a portion of a first side of the inorganic semiconducting layer, the porous nano-carbon film forming a source-channel interface with the inorganic semiconducting layer that includes open regions in the porous nano-carbon film;
a gate dielectric layer disposed on the porous nano-carbon film of the source electrode; and
a gate electrode disposed on the gate dielectric layer over at least a portion of the porous nano-carbon film, where a gate field produced by the gate electrode modulates a barrier height at the source-channel interface and modulates a barrier width based, at least in part on, modulating an accumulation of carriers in a semiconductor of the inorganic semiconducting layer in a vicinity of the porous nano-carbon film.

2. The tunable barrier transistor of claim 1, wherein the inorganic semiconducting layer comprises a crystalline semiconductor.

3. The tunable barrier transistor of claim 2, wherein the crystalline semiconductor is a single crystal semiconductor.

4. The tunable barrier transistor of claim 2, wherein the inorganic semiconducting layer comprises silicon (Si), gallium nitride (GaN), silicon carbide (SiC), aluminum nitride (AlN), or diamond.

5. The tunable barrier transistor of claim 1, wherein the porous nano-carbon film comprises a dilute network of carbon nanotubes.

6. The tunable barrier transistor of claim 5, wherein the dilute network of carbon nanotubes has a nanotube surface density in a range of 0.05 μg/cm$^2$ to 1.0 μg/cm$^2$ by mass.

7. The tunable barrier transistor of claim 1, wherein the porous nano-carbon film comprises a sheet of graphene with perforations.

8. The tunable barrier transistor of claim 1, wherein the gate dielectric layer comprises a high-k dielectric.

9. The tunable barrier transistor of claim 8, wherein a thickness of the gate dielectric layer is 100 nm or less.

10. The tunable barrier transistor of claim 9, wherein the gate dielectric layer exhibits dielectric breakdown at greater than 25 Volts.

11. The tunable barrier transistor of claim 1, further comprising:
a drain electrode comprising a nano-carbon film disposed on another portion of the first side of the inorganic semiconducting layer, the drain electrode separated from the source electrode by a distance, the nano-carbon film of the drain electrode separated from the porous nano-carbon film by a distance, wherein:
the gate dielectric layer is further disposed on the nano-carbon film of the drain electrode and at least a portion of a channel between the source electrode and the drain electrode; and
the gate electrode is further disposed on the gate dielectric layer over at least a portion of the nano-carbon film of the drain electrode that is disposed on the other portion of the first side of the inorganic semiconducting layer.

12. The tunable barrier transistor of claim 11, wherein the nano-carbon film of the drain electrode comprises a dilute network of carbon nanotubes.

13. The tunable barrier transistor of claim 11, wherein the nano-carbon film of the drain electrode comprises a sheet of graphene.

14. The tunable barrier transistor of claim 11, further comprising:
a second dielectric layer disposed on a portion of the first side of the inorganic semiconducting layer; and
a drain contact of the drain electrode disposed on the second dielectric layer, wherein the nano-carbon film of the drain electrode is coupled to the drain contact.

15. The tunable barrier transistor of claim 14, wherein the gate dielectric layer is further disposed on the drain contact.

16. The tunable barrier transistor of claim 11, further comprising a back gate electrode disposed on the second side of the inorganic semiconducting layer opposite the first side.

17. The tunable barrier transistor of claim 1, wherein modulation of the barrier width is based upon modulation of a density of carriers in the porous nano-carbon film and modulation of the barrier width at the source-channel interface by modulating the accumulation of carriers in the semiconductor in the vicinity of the porous nano-carbon film.

18. A tunable barrier transistor, comprising:
an inorganic semiconducting layer having a first side and a second side opposite the first side;
a source electrode comprising a porous nano-carbon film disposed on a portion of the first side of the inorganic semiconducting layer, the porous nano-carbon film forming a source-channel interface with the inorganic semiconducting layer that includes open regions in the porous nano-carbon film;
a gate dielectric layer disposed on the porous nano-carbon film of the source electrode;
a gate electrode disposed on the gate dielectric layer over at least a portion of the porous nano-carbon film, where a gate field produced by the gate electrode modulates a barrier height at the source-channel interface and modulates a barrier width at the source-channel interface based, at least in part on, modulating an accumulation of carriers in a semiconductor of the inorganic semiconductor layer in a vinicity of the porous nano-carbon film;
a second dielectric layer disposed on a portion of the first side of the inorganic semiconducting layer, wherein a portion of the porous nano-carbon film is disposed on the second dielectric layer; and
a source contact of the source electrode disposed on the second dielectric layer, wherein the porous nano-carbon film is coupled to the source contact.

19. The tunable barrier transistor of claim 18, wherein the gate dielectric layer is further disposed on the source contact.

* * * * *